(12) United States Patent
Rabe

(10) Patent No.: US 6,792,257 B2
(45) Date of Patent: Sep. 14, 2004

(54) METHOD FOR SELECTING A LOCAL ANTENNA FOR USE IN PRODUCING IMAGE DATA IN A DIAGNOSTIC MAGNETIC RESONANCE APPARATUS

(75) Inventor: Frank Rabe, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 463 days.

(21) Appl. No.: 09/769,896

(22) Filed: Jan. 25, 2001

(65) Prior Publication Data
US 2002/0016696 A1 Feb. 7, 2002

(30) Foreign Application Priority Data
Jan. 28, 2000 (DE) .......................... 100 03 712

(51) Int. Cl.[7] .............................. A62B 5/05; H04B 1/10
(52) U.S. Cl. .................. 455/277.1; 455/41.1; 600/410; 600/407; 600/422
(58) Field of Search ................................ 600/410, 407, 600/421, 422, 408, 409; 324/309, 304, 316, 317, 718, 322; 455/41.1, 277.1

(56) References Cited

U.S. PATENT DOCUMENTS

| | | | | |
|---|---|---|---|---|
| 4,924,868 A | * | 5/1990 | Krause et al. ............. | 600/422 |
| 5,122,749 A | | 6/1992 | Hashino | |
| 5,216,367 A | * | 6/1993 | Mori ........................... | 324/318 |
| 5,243,288 A | * | 9/1993 | Mori ........................... | 324/322 |
| 5,633,585 A | * | 5/1997 | Kuhn .......................... | 324/307 |
| 5,945,826 A | * | 8/1999 | Leussler ..................... | 324/309 |
| 6,134,465 A | * | 10/2000 | Frederick et al. ........... | 600/410 |
| 6,317,619 B1 | * | 11/2001 | Boernert et al. ............ | 600/410 |

FOREIGN PATENT DOCUMENTS

| | | |
|---|---|---|
| EP | 0 374 994 | 6/1990 |
| WO | WO 99/27381 | 6/1999 |

\* cited by examiner

Primary Examiner—Edward F. Urban
Assistant Examiner—Blane J. Jackson
(74) Attorney, Agent, or Firm—Schiff Hardin LLP

(57) ABSTRACT

In a method for the selection of a local antenna from among a number of local antennas that are spatially distributed in a diagnostic magnetic resonance apparatus, a target volume for the imaging is excited to emit magnetic resonance signals. The magnetic resonance signals are received with the local antennas. A characteristic quantity in the magnetic resonance signals respectively received by the local antennas is determined, this characteristic, for each antenna, quantity representing a measure for the distance of the target region from that local antenna. The local antenna is selected that is located closest to the target region, from among the multiple local antennas, dependent on the characteristic quantity.

6 Claims, 5 Drawing Sheets

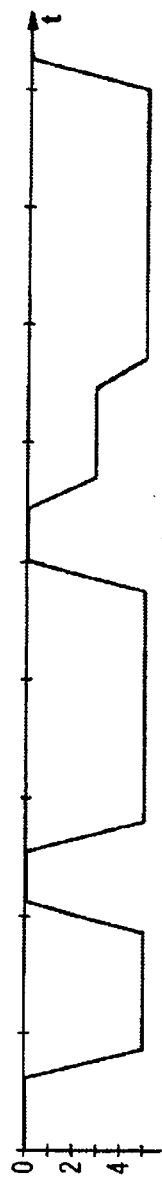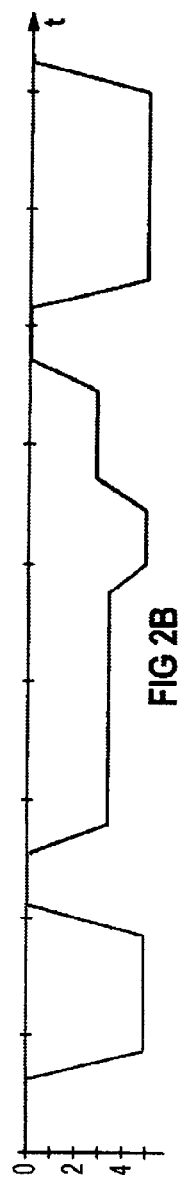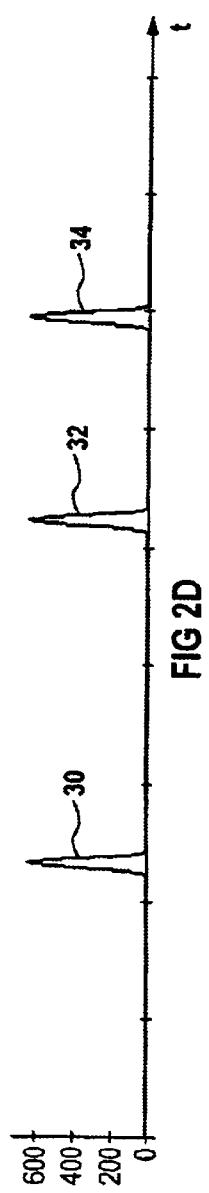

METHOD FOR SELECTING A LOCAL ANTENNA FOR USE IN PRODUCING IMAGE DATA IN A DIAGNOSTIC MAGNETIC RESONANCE APPARATUS

BACKGROUND OF THE INVENTION

1. Field of the Invention

The present invention is directed to a method for the selection of a local antenna from among a number of local antennas that are spatially distributed in a diagnostic magnetic resonance apparatus, for subsequent use for obtaining image data with the apparatus.

2. Description of the Prior Art

For improving the signal-to-noise ratio, and thus the imaging quality, local antennas that are positioned close to the signal-generating slice are utilized in diagnostic magnetic resonance apparatus. Such local antennas, however, have a pronounced directional characteristic and a non-uniform sensitivity distribution. In order to uniformly image an examination region, a number of local antennas (typically, 2–4) are simultaneously utilized. Respective, separate tomograms, that are subsequently combined, are calculated from the simultaneously received magnetic resonance signals of an excited slice. To that end, multi-channel reception paths, each with digitalization, demodulation, data acquisition and calculation must be provided in the magnetic resonance apparatus for the respective antennas.

The question of which of a number of local antennas should be used for imaging of a specific region also arises for a user. To this end, for example, measurement protocols that also prescribe a coil selection can be offered by the controller of the magnetic resonance apparatus for various body regions. These protocols, however, do not adapt to the differing anatomy of various patients. The slice to be measured, which has been set by the user, is not taken into consideration either. Frequently, the predetermined coil selection therefore must be adapted to the current situation, by settings made via a user interface. A non-optimum selection can thereby occur, so that measurements must be repeated because of the poor image quality.

SUMMARY OF THE INVENTION

An object of the present invention is to provide a method for the selection of one or more local antennas for a subsequent imaging from among a number of local antennas that are spatially distributed in a diagnostic magnetic resonance apparatus.

This object is achieved in accordance with the invention in a method which includes steps: A target volume for the imaging is excited to emit magnetic resonance signals. The magnetic resonance signals with multiple local antennas. A characteristic quantity in the magnetic resonance signals respectively received by the local antennas is determined, this characteristic quantity representing a measure for the distance of the target region from the respective local antennas. The local antenna is selected, from among the multiple antennas, that is located closest to the target region dependent on the characteristic quantity.

The method for selection is implemented before the actual imaging. A target volume is thereby excited to emit magnetic resonance signals, this target volume being exactly identified by the slice or slices selected by the user. Fundamentally, it has the shape of a cuboid that is oriented arbitrarily in space. This cuboid is defined such from the slices specified for the imaging measurement by the user so that is represents the smallest envelope for the specified slices.

In the general case, the magnetic resonance apparatus has fewer parallel radio-frequency reception channels it than there are local antennas. In an embodiment, following a connection of different local antennas to the respective radio-frequency reception channels, the excitation, reception and the determination of the characteristic quantity are repeated until the received magnetic resonance signals and thus the characteristic quantities, for all local antennas are obtained.

Since no resolution in the readout, phase coding and slice selection directions is needed for the determination of the characteristic quantity of the magnetic resonance signal received from the excited volume, the target volume is excited to emit stimulated echos in an embodiment. The volume-selective excitation thereby ensues with three radio-frequency pulses and orthogonal gradient pulses.

For example, the noise in the signal can be defined as the distance-dependent characteristic quantity. In a further embodiment, however, the amplitude of the received magnetic resonance signal is employed as the distance-dependent characteristic quantity. If the individual local antennas have different sensitivities, the coil selection can be determined from the signal amplitude normalized to the maximum sensitivity.

DESCRIPTION OF THE DRAWINGS

FIGS. 2A–2D illustrates a pulse sequence for generating stimulated echos in a target volume in accordance with the inventive method.

DESCRIPTION OF THE PREFERRED EMBODIMENTS

Figure 1:
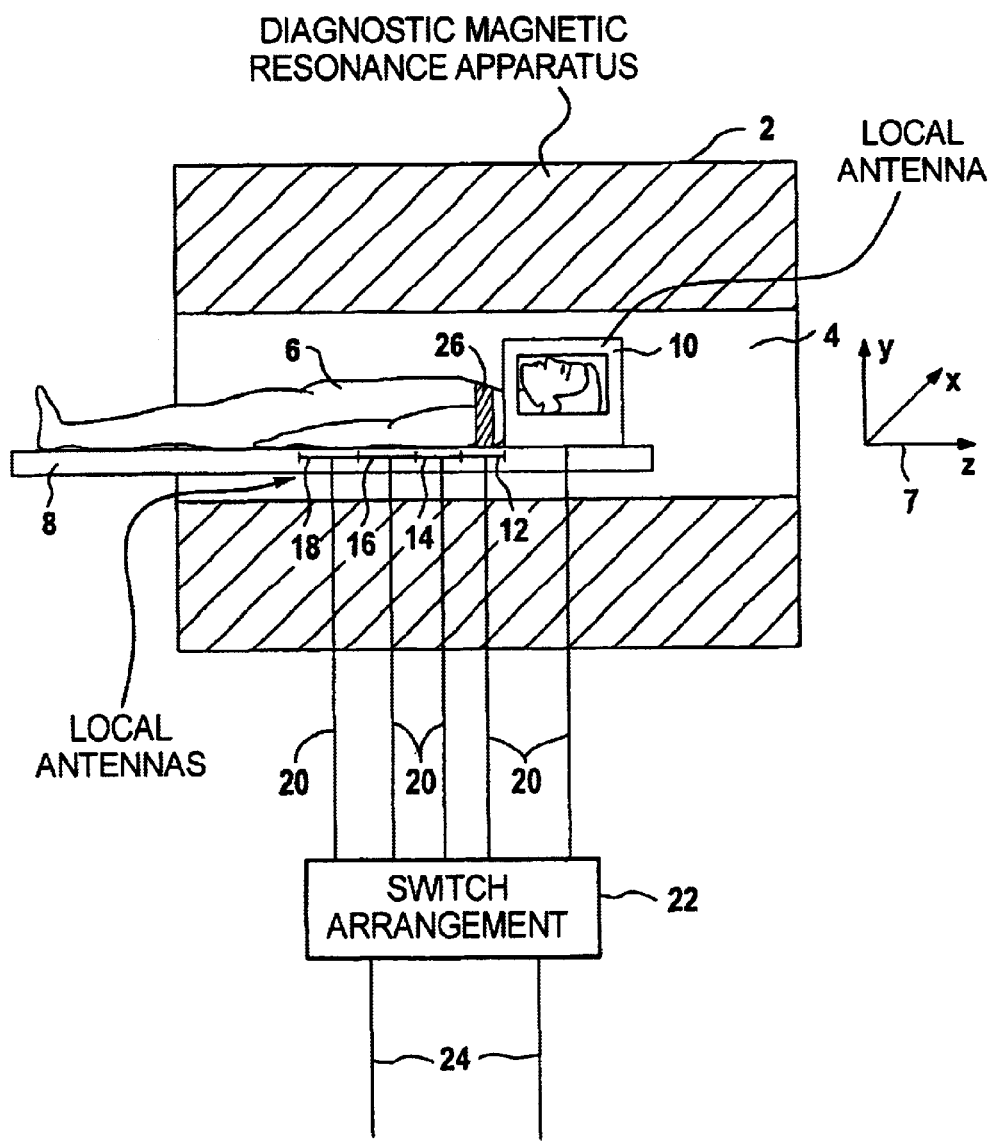
FIG. 1 is an overview of a diagnostic magnetic resonance apparatus having a number of local antennas, operable in accordance with the inventive method.

In an overview, FIG. 1 shows a diagnostic magnetic resonance apparatus 2 having a cylindrical examination volume 4 that is provided for the acceptance of a patient 6. To that end, the patient 6 is borne on a patient support 8 so as to be displaceable in the axial direction—the z-direction of a rectangular xyz coordinate system 7—of the examination volume 4. The origin of the coordinate system 7 lies in the isocenter of the magnetic resonance apparatus 2 or of the basic field magnet; it is shown outside of this only for reasons of clarity.

In addition to a whole-body antenna (not shown), the magnetic resonance apparatus 2 has a number of local antennas that are arranged in the immediate proximity of a body part to be examined. Thus, a first local antenna 10 is provided for examination of the head; further local antennas 12, 14, 16, 18 are permanently installed in the patient support 8. For example, spinal column examinations can be implemented with these. Signal lines 20 connected to the antennas 10 through 18 are connected via a switch arrangement 22 and to, radio-frequency channels 24 of the magnetic resonance apparatus 2. In the exemplary embodiment, two such channels 24 are provided.

The other function units of the diagnostic magnetic resonance apparatus are well-known to those of ordinary skill in the art, and thus not be discussed in detail herein.

The questions as to which of the local antennas 10 through 18 should be used to pick up magnetic resonance signals from a target volume 26 now arises for the user or physician before the imaging. To that end, the target volume is defined before the actual imaging. This, for example, can ensue interactively by a positioning of the desired imaging slices relative to previously measured overview images (localizer) with a suitable graphic user interface, or can ensue numerically with reference to the coordinate system 7.

A cuboid is thereby defined from the slice or slices provided for the imaging, this cuboid representing the smallest envelope around this slice or slices. Only the target volume 26 is then excited with a volume-selective excitation to emit stimulated echos. FIGS. 2A through 2C show the fundamental curve of the gradient pulses and FIG. 2D shows the curve of the RF pulses for a volume that is arranged in the isocenter of the magnet. Fundamentally, stimulated echos are generated by three successive radio-frequency pulses that are unequal to 180°. A first radio-frequency pulse 30 is emitted given simultaneously adjacent z-gradient (see FIG. 2C). The first radio-frequency pulse is thus effective in a slice that is aligned parallel to the xy-plane and whose thickness is predetermined by the boundaries of the target volume in the z-direction. Subsequently, a second radio-frequency pulse 32 with a simultaneously adjacent y-gradient is emitted. As a result a slice is correspondingly excited that is aligned parallel to the xz-plane and whose thickness is predetermined by the corresponding boundaries of the target volume 26 in the y-direction. Finally, a third radio-frequency pulse 34 with a simultaneously adjacent x-gradient is emitted. As a result a slice is excited that is aligned parallel to the yz-plane and whose thickness is predetermined by the boundaries of the target volume 26 in the x-direction. Since the radio-frequency pulses 30, 32, 34 act only in the target volume three times in succession, the stimulated echo is likewise emitted only from the target volume 26.

FIGS. 3 through 7 respectively show the stimulated echo signals received by the individual local antennas 10 through 18 as function of time after a corresponding demodulation.

Figure 3:
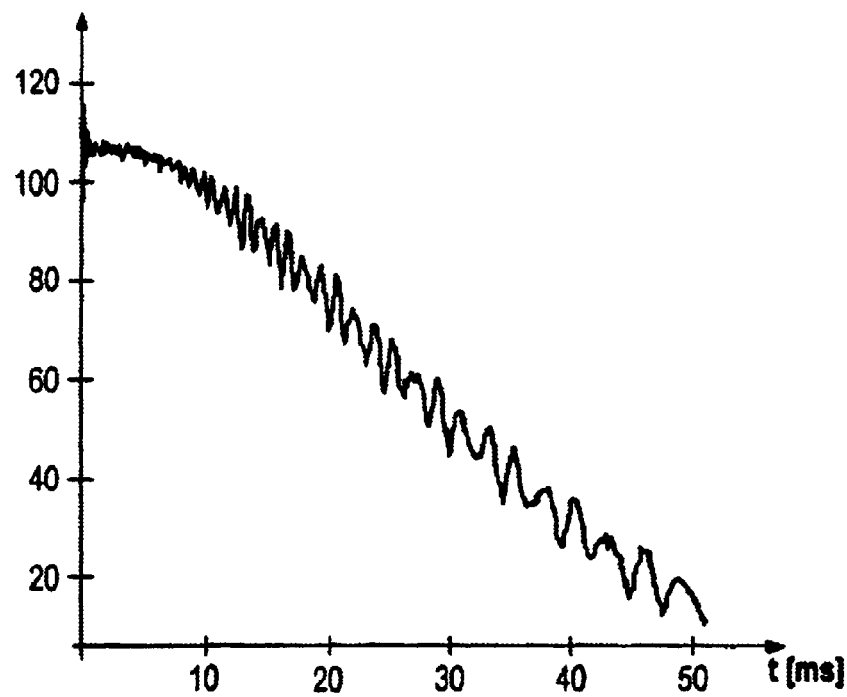
FIG. 3 shows the time curve of the amplitude of a magnetic resonance signal from the target volume that was received by a first local antenna in accordance with the inventive method.
Figure 4:
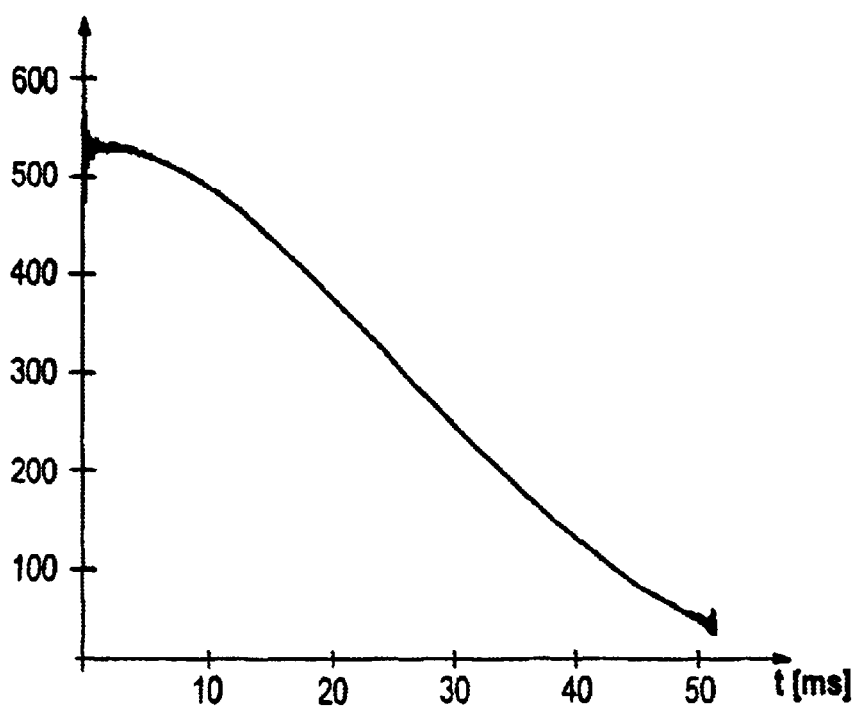
FIG. 4 shows the time curve of the amplitude of a magnetic resonance signal from the target volume that was received by a second local antenna in accordance with the inventive method.
Figure 5:
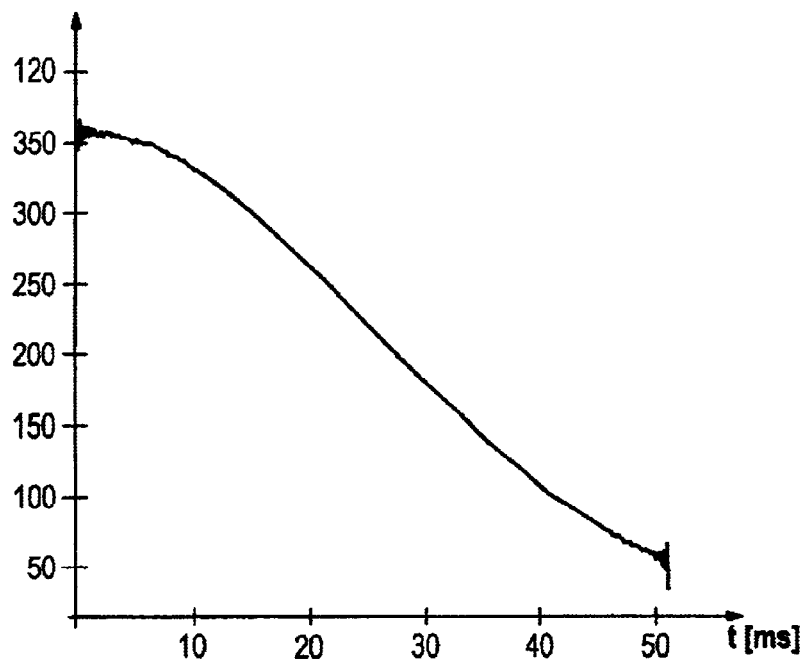
FIG. 5 shows the time curve of the amplitude of a magnetic resonance signal from the target volume that was received by a third local antenna in accordance with the inventive method.
Figure 6:
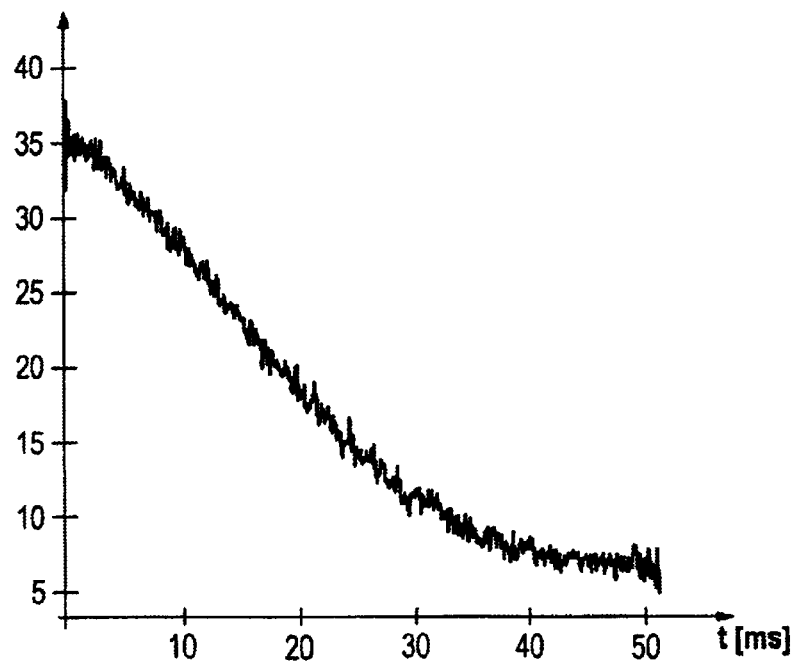
FIG. 6 shows the time curve of the amplitude of a magnetic resonance signal from the target volume that was received by a fourth local antenna in accordance with the inventive method.
Figure 7:
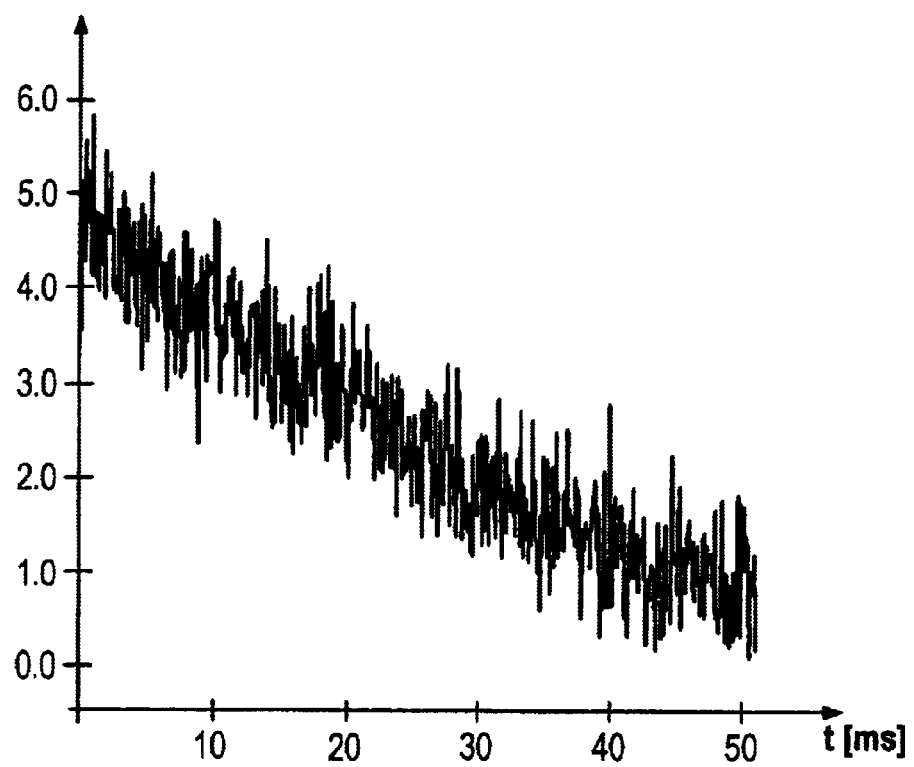
FIG. 7 shows the time curve of the amplitude of a magnetic resonance signal from the target volume that was received by a fifth local antenna in accordance with the inventive method.

FIG. 3 shows the signal received by the first local antenna 10 (head antenna), FIG. 4 the signal received by the second local antenna 12 (first spinal column antenna), FIG. 5 the signal received by the third local antenna 14 (second spinal column antenna), FIG. 6 the signal received by the fourth local antenna 16 (third spinal column antenna), and FIG. 7 shows the signal received by the fifth local antenna 18 (fourth spinal column antenna).

For the first ten through twenty samples, for example, a comparison of the signals from various local antennas 10 through 18 shows that the first spinal column antenna 12 is especially suited for the imaging of the target region 26. However, the second spinal column antenna 14 and the head antenna 10 also can be utilized for the imaging. By contrast, the third and fourth spinal column antenna 16 and 18 are no longer suited for the imaging. After an interrogation and evaluation of the samples by the device controller, the local antenna whose reception signal is highest is automatically activated and used for the following, actual imaging. Alternatively, those local antennas whose reception signals exceed a predetermined threshold can be employed for the imaging, assuming that enough parallel radio-frequency channels 24 are present in the magnetic resonance apparatus 2. When the sensitivities of the local antennas 18 differ, then a normalization of the reception signals respectively taking the maximum sensitivity into consideration must also ensue before the comparison.

Alternatively, the noise component in the reception signal can be employed instead of the amplitude or in addition thereto for the selection of the local antenna for the imaging. An increased noise component compared to the reception signals of the other local antennas can be clearly seen in the signal curve illustrated in FIGS. 6 and 7, which identifies these local antennas as unsuited for the subsequent imaging.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for selecting a local antenna, from among a plurality of local antennas, for use in producing imaging data in a diagnostic magnetic resonance apparatus, said plurality of local antennas being spatially distributed in said diagnostic magnetic resonance apparatus, said method comprising the steps of:

(a) exciting a target volume, related to an imaging volume to be subsequently imaged, to emit magnetic resonance signals;

(b) receiving said magnetic resonance signals with each local antenna in said plurality of local antennas;

(c) for each of said local antennas, determining a characteristic quantity in the magnetic resonance signal received by that local antenna, representing a measure of a distance of said target volume from that local antenna; and (d) activating only the local antenna in said plurality of local antennas that is located closest to the target region, for subsequent use in producing image data for said imaging volume, dependent on said characteristic quantity.

2. A method as claimed in claim 1 comprising providing a plurality of radio-frequency reception channels in said magnetic resonance apparatus which is fewer than said plurality of local antennas, and respectively connecting different ones of said local antennas to said radio-frequency reception channels and repeating steps (a) through (c) until all magnetic resonance signals for all of said local antennas have been supplied to said plurality of radio-frequency reception channels.

3. A method as claimed in claim 1 wherein step (d) comprises selecting at least one further local antenna, also for subsequent use for producing said image data for said imaging volume, dependent on said characteristic quality.

4. A method as claimed in claim 1 wherein step (d) comprises exciting said target volume to emit stimulated echoes as said magnetic resonance signals.

5. A method as claimed in claim 1 wherein step (c) comprises identifying respective amplitudes of the received magnetic resonance signals as said characteristic quantity.

6. A method as claimed in claim 1 wherein step (d) comprises identifying respective signal-to-noise ratios of the received magnetic resonance signals as said characteristic quantity.

* * * * *